United States Patent
Ohe et al.

(10) Patent No.: US 7,410,305 B2
(45) Date of Patent: Aug. 12, 2008

(54) OPTICAL SEMICONDUCTOR DEVICE, OPTICAL COMMUNICATION DEVICE, AND ELECTRONIC EQUIPMENT

(75) Inventors: Nobuyuki Ohe, Katsuragi (JP); Kazuhito Nagura, Kashihara (JP); Hideya Takakura, Nara-ken (JP); Kazuo Kusuda, Nara-ken (JP); Hiroyuki Shoji, Katsuragi (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 218 days.

(21) Appl. No.: 11/230,822

(22) Filed: Sep. 21, 2005

(65) Prior Publication Data
US 2006/0060882 A1      Mar. 23, 2006

(30) Foreign Application Priority Data
Sep. 22, 2004   (JP)   .......................... P2004-274695
Dec. 24, 2004   (JP)   .......................... P2004-373537

(51) Int. Cl.
*G02B 6/36*      (2006.01)

(52) U.S. Cl. .......................... 385/88; 385/94

(58) Field of Classification Search .................. None
See application file for complete search history.

(56) References Cited

U.S. PATENT DOCUMENTS

| | | | |
|---|---|---|---|
| 5,051,788 | A | 9/1991 | Tanaka |
| 6,627,328 | B2 | 9/2003 | Kanamaru et al. |
| 2002/0058145 | A1 | 5/2002 | Kanamaru et al. |
| 2004/0132867 | A1 | 7/2004 | Shibahara et al. |
| 2005/0082691 | A1* | 4/2005 | Ito et al. ..................... 257/788 |

FOREIGN PATENT DOCUMENTS

| | | |
|---|---|---|
| JP | 3-35017 A | 2/1991 |
| JP | 5-25397 A | 2/1993 |
| JP | 6-184281 A | 7/1994 |
| JP | 2002-88223 A | 3/2002 |
| JP | 2003-3043 A | 1/2003 |

\* cited by examiner

*Primary Examiner*—Sung H Pak
(74) *Attorney, Agent, or Firm*—Birch, Stewart, Kolasch & Birch, LLP

(57) ABSTRACT

An optical semiconductor device has an optical semiconductor element (2) such as an LED or PD, and a light-permeable resin (4) encapsulating the optical semiconductor element. The light-permeable resin contains a base resin and filler. The light-permeable resin (4) has a characteristic that its transmittance increases with a temperature rise within an operating temperature range (e.g., −40° C.−+85° C.).

16 Claims, 11 Drawing Sheets

OPTICAL SEMICONDUCTOR DEVICE, OPTICAL COMMUNICATION DEVICE, AND ELECTRONIC EQUIPMENT

This nonprovisional application claims priority under 35 U.S.C. §119(a) on Patent Application Nos. 2004-274695 and 2004-373537 filed in Japan on Sep. 22, 2004 and Dec. 24, 2004, respectively, the entire contents of which are hereby incorporated by reference.

BACKGROUND OF THE INVENTION

The present invention relates to an optical semiconductor device having an encapsulated optical semiconductor element, an optical communication device having the optical semiconductor device, and electronic equipment having the optical semiconductor device.

Conventionally, as an optical semiconductor device having an optical semiconductor element that requires light transmission, or optical penetration, such as a light emitting diode (LED) and a photodiode (PD), products produced by using the transfer molding of a light-permeable mold resin are widely used.

When a light-permeable mold resin is made of a single kind of resin mold material, there is an advantage that a particularly satisfactory light transmittance can be obtained, while such light-permeable mold resin has characteristics that its coefficient of thermal expansion is large. This raises a problem that a difference between the coefficient of linear expansion of the light-permeable mold resin and the coefficients of linear expansion of the optical semiconductor device, the lead frame and the bonding wire would cause disconnection of the bonding wire and occurrence of cracks in the package and the like in a high operating temperature range, as a consequence of which it becomes difficult to produce an optical semiconductor device of high reliability.

As a method for controlling the coefficient of thermal expansion of the light-permeable mold resin, adding filler to the resin mold material is known. Typical fillers include transparent inorganic powder of glass or the like.

FIG. 16 is a graph showing the temperature dependence of the refractive index of a filler material (glass) and the temperature dependence of the refractive index of a resin mold material (hereinafter referred to as a base resin mold material) to which no filler is added. In detail, FIG. 16 shows a graph showing the refractive indexes of the filler material and the base resin mold material in the form of relative values with the refractive index at a temperature of 25° C. assuming a value of one, wherein the filler material and the base resin mold material is adjusted such that a refractive index difference between them becomes zero at the temperature of 25° C. In FIG. 16, the filler material is silica glass, and the base resin mold material is an acid-anhydrous epoxy resin or a phenolic epoxy resin.

Also, in FIG. 16, the dashed line represents the temperature dependence of the refractive index of the filler material, and the solid line represents the temperature dependence of the refractive index of the base resin mold material.

As shown in FIG. 16, the refractive index of the base resin mold material exhibits a tendency of decrease as the temperature rises, while the refractive index of the filler material has no temperature dependence and exhibits a tendency of constancy.

FIG. 17 is a graph showing the temperature dependence of the light transmittance of the resin mold material when the filler is added to the base resin.

In FIG. 17, the light transmittance at 25° C. is assumed to have a value of one, and the light transmittances at other temperatures are represented by values relative to the light transmittance at 25° C.

In FIG. 17, the light transmittance depends on the refractive index difference between the base resin and the filler, and the light transmittance is one at the temperature at which the refractive index difference is zero. Then, the light transmittance exhibits a tendency of decrease as the refractive index difference is increased.

For the above reasons, since the refractive index difference is zero at 25° C. in the case of FIG. 17, the light transmittance at 25° C. is the highest, and the light transmittance exhibits a tendency of decrease as the temperature rises from 25° C.

FIG. 18 is a graph showing the temperature dependence of the optical output power of a general LED.

In FIG. 18, the optical output power at 25° C. is assumed to be one, and the optical output powers at other temperatures are represented by values relative to the output power at 25° C.

As shown in FIG. 18, the optical output power exhibits a tendency of decrease with the temperature rise. As shown in FIG. 18, the general LED, of which the optical output power has the tendency of decrease with the temperature rise, therefore has a problem that a decrease in the optical output power becomes significant at high temperatures and it is difficult to provide an optical semiconductor device having a constant optical output power at temperatures within the operating temperature range.

FIG. 19 is a graph showing a measurement result of the temperature dependence of the optical output power when the LED is encapsulated in a light-permeable resin to which no filler is added, and a measurement result of the temperature dependence of the optical output power when the LED is encapsulated in the light-permeable resin to which filler is added.

In FIG. 19, the solid line represents the temperature dependence of the optical output power in the case of encapsulation in the light-permeable resin to which filler is added, and the dashed line represents the temperature dependence of the optical output power in the case of encapsulation in the light-permeable resin to which no filler is added.

In FIG. 19, the optical output power at 25° C. is given a value of one, and relative value representation is provided.

As shown in FIG. 19, the optical output power of the LED when the filler is added has a larger fluctuation in the optical output power than when no filler is added. This is presumably attributed to a decrease in the light transmittance as a consequence of an increasing refractive index difference between the added filler and the base resin due to the temperature change.

Moreover, as shown in FIG. 19, when no filler is added, the fluctuation in the optical output power has a tendency that the fluctuation can be approximated by a linear equation (col-linear approximation). When the filler is added, the fluctuation in the optical output power has a tendency that the fluctuation cannot be approximated by a linear equation. This means that a point at which the refractive index difference between the added filler and the base resin is zero (indicated by A in FIG. 19) is within the measurement temperature range.

As shown in FIG. 19, the conventional optical semiconductor device that uses the resin to which filler is added as an encapsulating resin has a problem that the characteristics of the optical semiconductor device are not stabilized within the operating temperature range.

JP 2003-3043 A discloses that epoxy resin is used as a base resin material and non-alkali glass filler is used as a glass filler material.

JP 2002-88223 A is another prior art reference that discloses a material obtained by adding filler to a resin mold material.

The reference discloses an epoxy resin to which an effect accelerating agent and inorganic filler are added. The reference also discloses that the epoxy resin has a high transparency under various temperature environments and is excellent in heat resistance, moisture resistance and low stressedness.

However, the epoxy resin, which has a high transparency under various temperature environments and is excellent in heat resistance, moisture resistance and low stressedness, has a problem that the light transmittance decreases as the temperature rises and the characteristics of the optical semiconductor device can hardly be stabilized at high temperatures, as may be understood from the fact that the transmittance decreases from 100 to 70 as the temperature rises from 25° C. to 100° C.

JP H05-25397 A also discloses a resin composition, of which the light transmittance reversibly varies with the temperature change and the coefficient of thermal expansion is small and which provides a hardened body that has excellent repetition durability.

However, there is a problem that it is unclear whether or not the resin composition is usable for the optical semiconductor device, i.e., whether or not the resin composition causes some trouble when it is used for the optical semiconductor device. There is a further problem that even if the resin composition can be used, the manufacturing method of an optical semiconductor device having the resin composition is not known.

SUMMARY OF THE INVENTION

An object of the present invention is to provide an optical semiconductor device which has an appropriate light transmittance at temperatures within an operating temperature range and which exhibits excellent operating characteristics at temperatures within the operating temperature range, and also to provide an optical communication device having the optical semiconductor device and electronic equipment having the optical semiconductor device.

In order to solve the problem, an optical semiconductor device according to an aspect of the present invention has an optical semiconductor element, and a light-permeable resin that is arranged to encapsulate the optical semiconductor element and that comprises a base resin and filler. The light-permeable resin has a transmittance that increases with a temperature rise within an operating temperature range.

It is to be noted that the term "optical semiconductor element" herein means one in a chip state.

According to the present invention, the transmittance of the light-permeable resin increases with the temperature rise as far as the temperature is within the operating temperature range. Therefore, if the optical semiconductor device has an optical semiconductor element of which the quantity of light to be handled tends to decrease with a temperature rise as in, for example, a case of using a light-emitting element having a decreasing emitted light with a temperature rise or using a photodetector placed in a situation in which the quantity of incident light decreases with a temperature rise, the temperature dependence of the quantity of light can be compensated for and canceled by the temperature dependence of the transmittance of the light-permeable resin. Therefore, the operating characteristics can be made constant irrespective of the temperature change within the operating temperature range so that the device becomes excellent in stability and reliability.

Moreover, according to the present invention, the light-permeable resin contains the filler, and therefore, the coefficient of linear expansion of the light-permeable resin can be reduced by the filler. Accordingly, breaking of the bonding wire, occurrence of cracks in the package, and the like are reliably prevented in a high temperature region within the operating temperature range, so that the durability can be largely improved.

As materials of the base resin and the filler, any materials are usable as far as the materials meet the condition that the transmittance of the light-permeable resin increases with a temperature rise within the operating temperature range of the device. For example, various types of epoxy resins may be used for the base resin, and various types of glass materials may be used for the filler.

In one embodiment, the base resin and the filler of the light-permeable resin have refractive indexes that coincide with each other at one temperature higher than an upper limit of the operating temperature range.

According to the embodiment, the light transmittance of the light-permeable resin can be varied to rise as the temperature rises all over the entire operating temperature range. Therefore, the operating characteristics can be stabilized all over the entire operating temperature range.

In one embodiment, the optical semiconductor element is a light-emitting element.

According to the embodiment, the operating characteristics that the output intensity deceases with the temperature rise of the light-emitting element can be compensated with the material property of the light-permeable resin that the light transmittance increases with the temperature rise. Therefore, the quantity of light to be outputted from the optical semiconductor device is made roughly constant irrespective of the temperature, and the reliability of the operating characteristics is largely improved.

In one embodiment, the optical semiconductor element is a photodetector.

According to the embodiment, the photodetection sensitivity gradually increases as the temperature rises, and the photodetection sensitivity becomes maximum at the upper limit of the operating temperature. Therefore, when the quantity of received light decreases as the temperature rises as in a case where light is received from a light-emitting element having a characteristic that its output decreases with the temperature rise, the reduction in the quantity of light due to the temperature dependence can be compensated or corrected, and a high sensitivity can be obtained irrespective of the temperature variation within the operating temperature range.

In one embodiment, a factor of transmittance increase of the light-permeable resin due to a temperature rise roughly counterbalances a factor of optical output power reduction of the light-emitting element due to the temperature rise.

In the present specification, the "factor of transmittance increase" is defined by a variation in the transmittance with respect to a temperature rise per unit time (a negative value is taken in the case of transmittance decrease), and the "factor of optical output power reduction" is defined by a variation in the quantity of light emitted from the light-emitting element with respect to a temperature rise per unit time (a negative value is taken in the case of decrease of the light quantity).

In one embodiment, the factor of transmittance increase of the light-permeable resin corresponds to an amount of the filler in the light-permeable resin.

The factor of transmittance increase due to the temperature rise of the light-permeable resin can easily be varied by changing the amount of the filler in the light-permeable resin.

In one embodiment, the factor of transmittance increase of the light-permeable resin corresponds to a quantity of decrease in refractive index of the base resin of the light-permeable resin with the temperature rise.

By controlling the amount of decrease in the refractive index of the base resin with respect to the temperature rise, the factor of transmittance increase of the light-permeable resin can easily be varied.

In one embodiment, the optical semiconductor device further has a light-emitting element driving circuit for driving the light-emitting element. The light-emitting element driving circuit has a correction circuit for correcting a variation in the optical output power of the light-emitting element due to a temperature rise.

In the embodiment, the optical output power of the optical semiconductor device is made roughly constant irrespective of the temperature variation within the operating temperature range of the device, so that the operating characteristics are stabilized.

In one embodiment, a reduction in the optical output power of the light-emitting element due to the temperature rise is canceled by an increase in the transmittance of the light-permeable resin due to the temperature rise and a correction of the variation in the optical output power by the correction circuit of the light-emitting element driving circuit.

An optical communication device according to the present invention has the aforementioned optical semiconductor device of the present invention and an optical fiber so as to transmit and/or receive an optical signal using the optical fiber as a transmission medium, wherein an attenuation rate of communication light in the optical fiber due to a temperature rise of the optical fiber corresponds to a factor of transmittance increase due to a temperature rise of the light-permeable resin of the optical semiconductor device.

According to the present invention, the attenuation of the communication light in the optical fiber due to the temperature rise of the optical fiber can be compensated by the increase of the transmittance of the light-permeable resin as the temperature rises. Thus, optical fiber transmission of high communication quality is performed.

Also, there is provided, according to the present invention, an optical communication device which has the aforementioned optical semiconductor device of the present invention and an optical fiber so as to transmit and/or receive an optical signal using the optical fiber as a transmission medium, wherein a rate of attenuation of communication light in the optical fiber ascribed to a change in emission wavelength due to a temperature rise of the optical semiconductor element in the optical semiconductor device corresponds to a factor of transmittance increase due to a temperature rise of the light-permeable resin.

According to the present invention, the attenuation of the communication light in the optical fiber due to the change in transmission wavelength can be compensated by the increase of the transmittance of the light-permeable resin as the temperature rises. Thus, optical fiber transmission of high communication quality is performed.

An optical semiconductor device according to another aspect of the present invention has an optical semiconductor element, and a mold resin portion having light permeability that encapsulates the optical semiconductor element, wherein the optical semiconductor element emits light to outside the mold resin portion or receives light incident from outside the mold resin portion, and the mold resin portion comprises a phenolic cured resin and transparent filler made of silica glass.

The "phenolic cured resin" here means a resin that contains a phenolic curing agent and is typified by epoxy resins.

In the optical semiconductor device of the present invention, because there is little difference in refractive index between the transparent filler made of silica glass and the phenolic cured resin, decrease in light transmittance of the mold resin can be prevented. Moreover, since the transparent filler made of silica glass is contained in the mold resin portion, the mold resin portion is allowed to have a reduced coefficient of linear expansion, so that a possible difference in coefficient of linear expansion between the optical semiconductor element, a lead frame, and a wire (gold wire) becomes small. This will suppress the breaking of the bonding wire and the occurrence of cracks in the package due to a thermal stress.

Thus, an optical semiconductor device superior in reliability and light transmittance is realized. In particular, a high reliability level required of in-vehicle devices (which are placed at an operating temperature of, for example, −40° C. to 105° C.) is satisfied.

In one embodiment, an absolute value of a refractive index difference between the transparent filler and the phenolic cured resin is not greater than 0.02 as far as an operating temperature of the device is within a range of from −40° C. to 105° C.

In this embodiment, the light transmittance of the mold resin portion hardly decreases.

In one embodiment, a content of the transparent filler in the mold resin portion is 40-80 wt %.

In this embodiment, the difference in coefficient of linear expansion between the mold resin portion and parts encapsulated in the mold resin portion (hereinafter referred to as "encapsulated parts") can reliably be reduced, and the device becomes superior in reliability. More specifically, if a content of the transparent filler is smaller than 40 wt %, the difference in coefficient of linear expansion between the mold resin portion and the encapsulated parts becomes large, as a result of which there may occur breaking of the bonding wire and cracks in the package and the like. On the other hand, if the transparent filler content exceeds 80 wt %, there is a drawback that the flow of the resin becomes worse.

In one embodiment, the transparent filler comprises generally spherical pieces.

In this embodiment, scattering of light at the interface between the pieces of the transparent filler and the phenolic cured resin is suppressed.

In one embodiment, the mold resin portion has a lens.

According to the embodiment, the provision of the lens in combination with the spherical transparent filler in the mold resin portion improves the optical output power. That is, the optical semiconductor device has good light transmittance.

In one embodiment, the mold resin portion contains a release agent.

According to the embodiment, because the mold resin portion contains the release agent, it is no more required to apply a release agent to a metal mold before molding the optical semiconductor element with the metal mold. Thus, the manufacturing efficiency is improved.

Electronic equipment of the present invention includes the optical semiconductor device according to any one of the above aspects of the present invention.

The electronic equipment, in which its optical semiconductor element stably operates even under severe temperature conditions and is therefore superior in durability, is usable as, for example, an in-vehicle device placed under severe environments.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1A:
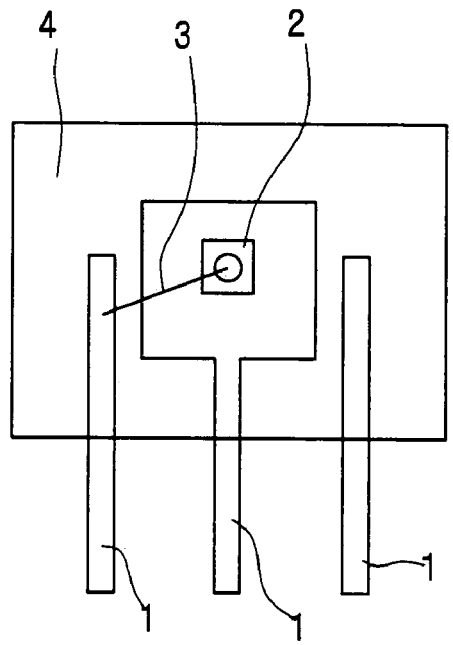
FIGS. 1A and 1B are a front see-through view and a side see-through view of an optical semiconductor device according to a first embodiment of the present invention.

The present invention will be described in detail below based on the embodiments shown in the drawings.

First Embodiment

Figure 1B:
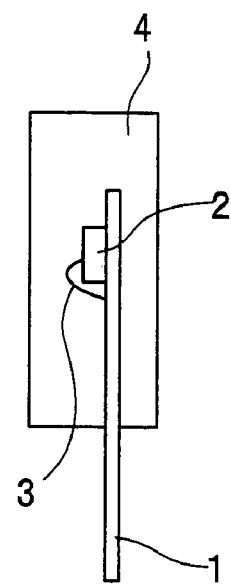

FIGS. 1A and 1B are views showing an optical semiconductor device of a first embodiment of the present invention. In detail, FIG. 1A is a front see-through view of the optical semiconductor device of the first embodiment, and FIG. 1B is a side see-through view of the optical semiconductor device of the first embodiment.

The optical semiconductor device has a lead frame 1, an LED 2 as one example of the optical semiconductor element, a wire 3 and a light-permeable mold resin 4 to which filler is added.

The wire 3 is constituted of a wire that has electrical conductivity, such as an Au wire, an Ag wire or an Al wire. Moreover, the mold resin 4 is formed by adding glass as filler to an epoxy resin. As the epoxy resin, various types of commercially available epoxy resins are usable. Also, as the glass filler, any type of commercially available glass filler is usable. Accordingly, the "epoxy resin" and the "glass filler" herein should not be interpreted as being limited to specific ones unless the types of the epoxy resin and glass filler are specified.

A back electrode of the LED 2 is die-bonded to the lead frame 1 by using a conductive material such as an Ag paste. A surface electrode of the LED 2 is wire-bonded to the lead frame 1 via the wire 3. The LED 2 mounted on the lead frame 1 is encapsulated in the light-permeable mold resin 4 to which filler is added, by transfer molding technique.

Figure 2:
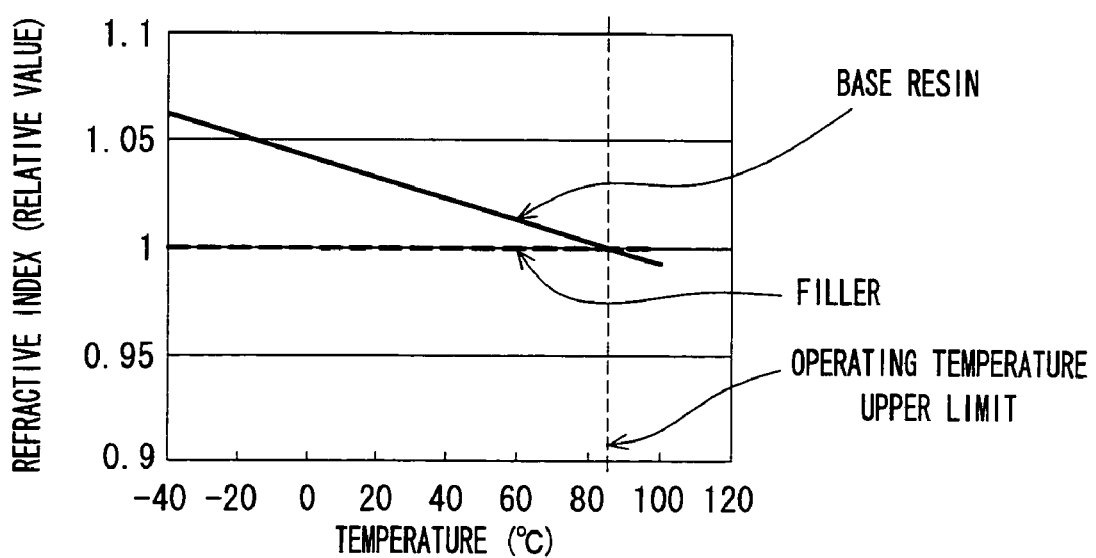
FIG. 2 is a graph showing the temperature dependence of the refractive index of a base resin used for the optical semiconductor device of the first embodiment and the temperature dependence of the refractive index of a filler used for the optical semiconductor device of the first embodiment.

FIG. 2 is a graph showing the temperature dependence of the refractive index of the base resin used for the optical semiconductor device of the first embodiment and the temperature dependence of the refractive index of the filler used for the optical semiconductor device of the first embodiment.

In FIG. 2, the solid line represents the temperature dependence of the refractive index of the base resin, and the dashed line represents the temperature dependence of the refractive index of the filler. In FIG. 2, the refractive index of the base resin at a temperature of 85° C. is assumed to be one ("1"), and refractive indexes of the base resin and refractive indexes of the filler at temperatures other than 85° C. are represented by the relative values with respect to the refractive index of the base resin at 85° C.

The optical semiconductor device of the first embodiment is designed such that it is operable in an operating temperature range of from −40° C. to +85° C. Moreover, as shown in FIG. 2, the base resin and the filler are designed such that the refractive index of the base resin becomes identical to the refractive index of the filler at 85° C. that is the upper limit of the operating temperature. Moreover, a material of which the refractive index hardly varies at temperatures within the temperature range of from −40° C. to +85° C. is used for the filler, while a material of which the refractive index decreases as the temperature rises within the temperature range of from −40° C. to +85+85° C. is used for the base resin. It should be noted that although in the first embodiment the upper limit of the operating temperature range is set at +85° C., the upper limit may be set at a larger value, such as for example 100° C. or more, based on which value the refractive indexes of the base resin and of the filler should be adjusted.

Figure 3:
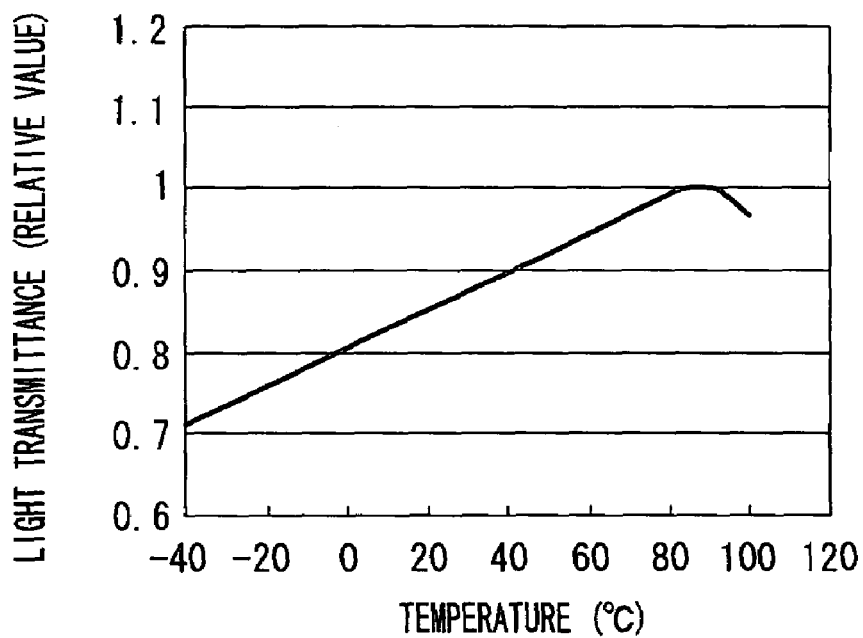
FIG. 3 is a graph showing the temperature dependence of the light transmittance of the optical semiconductor device of the first embodiment.

FIG. 3 is a graph showing the temperature dependence of the light transmittance of the optical semiconductor device of the first embodiment.

As described above, the light transmittance at a certain temperature of the mold resin to which filler is added depends on the difference between the refractive index of the filler and the refractive index of the base resin at the temperature.

As shown in FIG. 3, the mold resin, which is produced by using the filler and the base resin having the temperature dependence of the refractive index shown in FIG. 3, has a characteristic that the light transmittance increases as the temperature rises within the operating temperature range.

A rate of increase (slope) of the light transmittance with respect to the temperature rise can be controlled by a method using a rate of change in the temperature dependence of the refractive index of the base resin or a method using the dosage of the filler. In other words, there are a method by which the rate of increase (slope) of the light transmittance with respect to the temperature rise corresponds to the rate of change in the temperature dependence of the refractive index of the base resin and a method by which the rate of increase (slope) of the light transmittance with respect to the temperature rise corresponds to the dosage of the filler.

These methods will be described below.

The method using the rate of change in the temperature dependence of the refractive index of the base resin will be described first. In general, it is known that the temperature dependence of the refractive index of the base resin is larger than the temperature dependence of the refractive index of the filler, and the slope of the increase in the light transmittance depends on the rate of change in the temperature dependence of the refractive index of the base resin. Therefore, if a material of large temperature dependence of the refractive index is used for the base resin, the slope of the increase in the light transmittance can be increased. On the contrary, if a material of small temperature dependence of the refractive index is used for the base resin, the slope of the increase in the light transmittance can be reduced. The method using the rate of change of the temperature dependence of the refractive index of the base resin includes controlling of materials of the base resin to thereby control the rate of increase in the light transmittance. Methods of controlling or regulating materials of the base resin includes changing types of compositions, changing curing agents, and so on. Alternatively, it is also possible to adopt a method by which a plurality of base resins of different refractive indexes are prepared and a mixture ratio of these base resins are changed such that the refractive index of the mixture of the base resins is adjusted.

The method using the dosage of the filler will be described next.

The light transmittance at a temperature depends on a difference between the refractive index of the base resin and the refractive index of the filler at the temperature. Therefore, by controlling the dosage of the filler, the slope of the increase in the light transmittance can be controlled. In detail, if the device is used at temperatures at which there is a refractive index difference between the base resin and the filler, the slope of the increase in the light transmittance can be increased by increasing the dosage of the filler. On the contrary, the slope of the increase in the light transmittance can be reduced by reducing the dosage of the filler. The method utilizing the dosage of the filler is to control the rate of increase in the light transmittance by controlling the dosage of the filler to be added.

Figure 4:
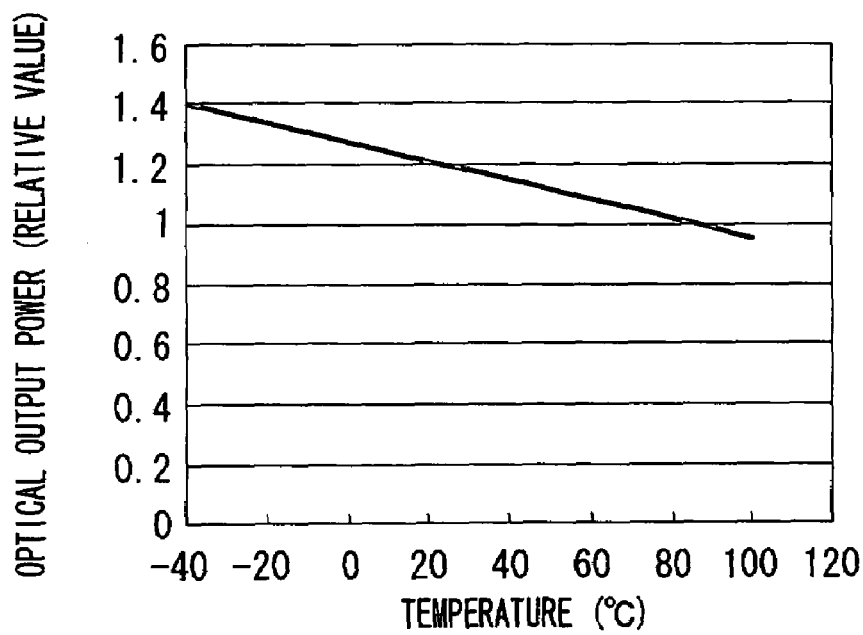
FIG. 4 is a graph showing the temperature dependence of the optical output power of an LED owned by the optical semiconductor device of the first embodiment.

FIG. 4 is a graph showing the temperature dependence of the optical output power of the LED 2 owned by the optical semiconductor device of the first embodiment. It is known that in general, LEDs have a tendency that their optical output powers decrease with a temperature rise, and as shown in FIG. 4, the LED 2 also has a decreasing optical output power with the temperature rise as in the general LEDs.

Figure 5:
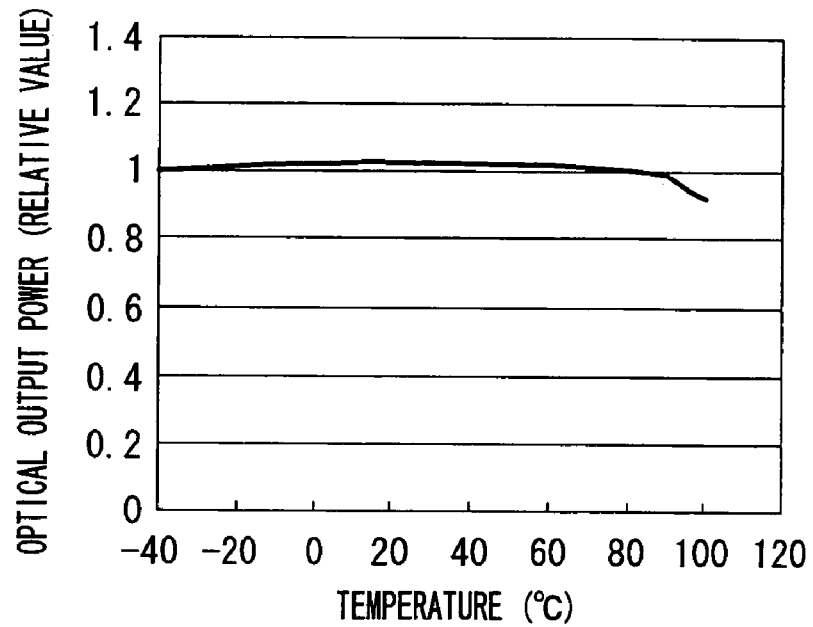
FIG. 5 is a graph showing the temperature dependence of the optical output power of the optical semiconductor device of the first embodiment.

FIG. 5 is a graph showing the temperature dependence of the optical output power of the optical semiconductor device of the first embodiment.

As shown in FIG. 5, the optical output power of the optical semiconductor device of the first embodiment has no temperature dependence within the operating temperature range of the device, meaning that the optical semiconductor device of the first embodiment has good operating characteristics in that the optical output power does not vary within the operating temperature range of the device.

In the optical semiconductor device of the first embodiment, by making the transmittance of the mold resin 4 correspond to the optical output power of the LED 2, i.e., by counterbalancing the reduction of the optical output power of the LED 2 as the temperature rises with the increase of the transmittance of the mold resin 4 as the temperature rises, the optical semiconductor device is given a superior optical output characteristic that does not vary with the temperature change.

Because the optical semiconductor device of the first embodiment adopts, as the mold resin 4 for encapsulating the LED 2, a mold resin containing glass whose light transmittance is adapted to cancel the rate of decrease of the optical output power of the LED 2 per the temperature change. Therefore, the optical output power of the beam emitted from the optical semiconductor device can be made roughly constant within the operating temperature range, and the operating characteristics of the optical semiconductor device can largely be improved.

Although glass is adopted as the filler and the mold resin 4 obtained by adding glass to an epoxy resin is adopted in the optical semiconductor device of the first embodiment, the optical semiconductor device of the present invention may use filler materials such as silica, alumina, quartz or the like other than the glass.

Moreover, although the filler-added resin is used for the mold portion of the optical semiconductor device in the optical semiconductor device of the first embodiment, the filler-added resin may be additionally used for the portions such as, for example, a lens or other optical path portions. For the lens, it is acceptable to use a thermosetting resin or a thermoplastic resin. As the thermoplastic resin, a light-permeable material such as acrylic, polycarbonate, or the like is usable. Also, as the filler, glass or other material such as silica, alumina, quartz or the like may be used.

Moreover, in the optical semiconductor device of the first embodiment, the refractive index of the base resin and the refractive index of the filler are made identical to each other at +85° C. that is the upper limit of the operating temperature region of the device. However, the optical semiconductor device of the present invention may adopt a base resin material and a filler material which satisfy the condition that, letting the refractive index of the base resin nb and the refractive index of the filler nf, then nb≧nf holds in a temperature region having temperatures higher than the upper limit of the operating temperature region. In this case as well, the operative effect similar to that of the optical semiconductor device of the first embodiment is obtainable.

Second Embodiment

Figure 6A:
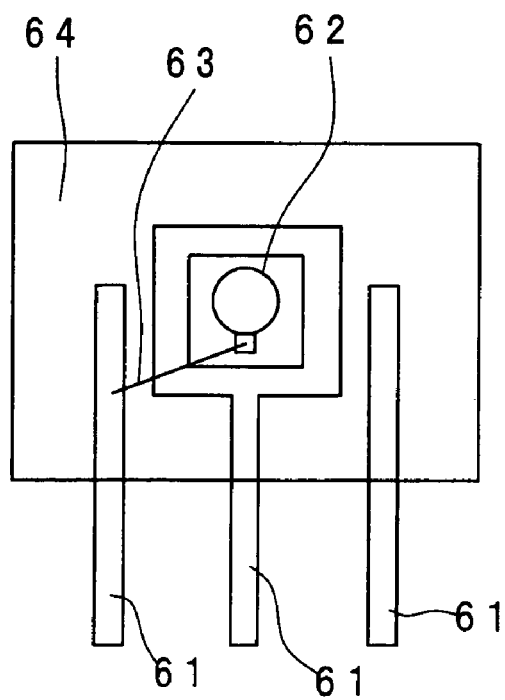
FIGS. 6A and 6B are a front see-through view and a side see-through view of an optical semiconductor device according to a second embodiment of the present invention.
Figure 6B:
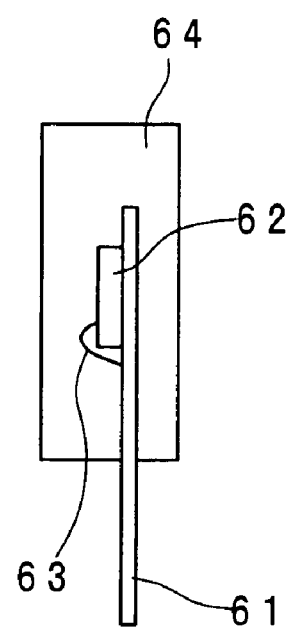

FIGS. 6A and 6B are views showing an optical semiconductor device according to a second embodiment of the present invention. In detail, FIG. 6A is a front see-through view of the optical semiconductor device of the second embodiment, and FIG. 6B is a side see-through view of the optical semiconductor device of the second embodiment.

The optical semiconductor device of the second embodiment differs from the optical semiconductor device of the first embodiment essentially in that a photodiode (PD) 62, which is a photodetector, is adopted in place of the light-emitting element (LED) as the optical semiconductor element.

Regarding the optical semiconductor device of the second embodiment, no description will be provided for the same effects and advantages as those of the optical semiconductor device of the first embodiment and its modification examples, and only the construction and the effects and advantages different from those of the optical semiconductor device of the first embodiment will be described.

The optical semiconductor device has a lead frame 61, a PD 62 as one example of the optical semiconductor element, a wire 63, and a light-permeable mold resin 64 to which filler is added. The wire 63 is constituted of a wire that has electrical conductivity, such as an Au wire, an Ag wire or an Al wire. The mold resin 64 is formed by adding glass as filler to an epoxy base resin. The light transmittance of the mold resin 64 increases as the temperature rises within the operating temperature range of the optical semiconductor device.

The photodetection current of the PD 62 has almost no temperature dependence like the photodetection current of a general photodiode and is roughly constant within the operating temperature range of the device.

The optical semiconductor device of the second embodiment adopts the mold resin 64 of which the light transmittance increases as the temperature rises within the operating temperature range of the optical semiconductor device and adopts the PD 62 that has a roughly constant photodetection current within the operating temperature range. Therefore, the photodetection sensitivity of the PD 62 can be made maximum at the upper limit of the operating temperature of the optical semiconductor device. Therefore, although the optical output power of the general light-emitting element tends to be reduced at high temperatures, as described above, use of the PD 62 would compensate a reduction in the optical output power of such a light-emitting element on the other side. Therefore, electronic equipment, such as an optical communication module or the like, having the optical semiconductor device of the second embodiment and a light-emitting element that transmits an optical signal would have good characteristics free from the temperature dependence.

Third Embodiment

Figure 7A:
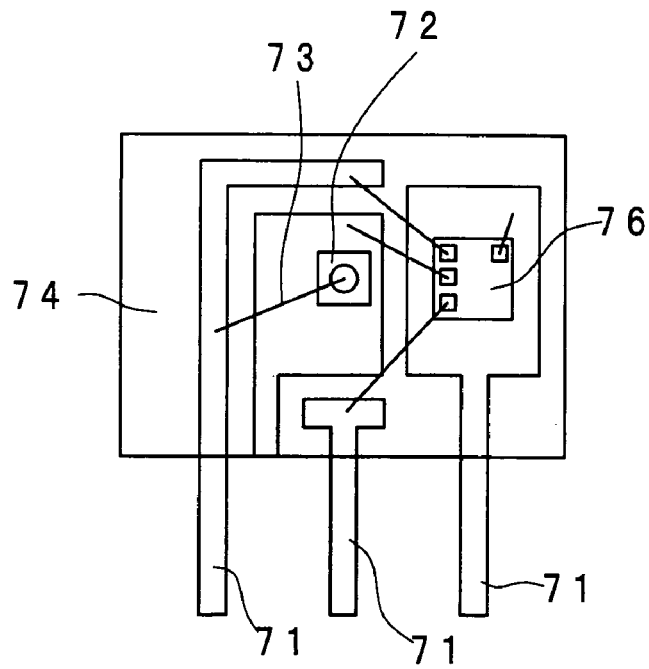
FIGS. 7A and 7B are a front see-through view and a side see-through view of an optical semiconductor device according to a third embodiment of the present invention.
Figure 7B:
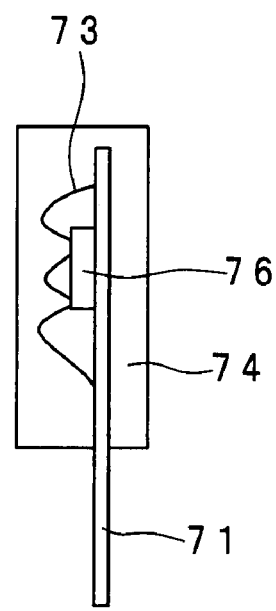

FIGS. 7A and 7B are views showing an optical semiconductor device of a third embodiment of the present invention. In detail, FIG. 7A is a front see-through view of the optical semiconductor device of the third embodiment, and FIG. 7B is a side see-through view of the optical semiconductor device of the third embodiment.

The optical semiconductor device of the third embodiment differs from the optical semiconductor device of the first embodiment essentially in that a driving integrated circuit 76 for driving an LED 72 is provided.

Regarding the optical semiconductor device of the third embodiment, no description will be provided for the same construction and effects as those of the optical semiconductor device of the first embodiment and its modification examples, and only the construction and effects different from those of the optical semiconductor device of the first embodiment will be described.

The optical semiconductor device has a lead frame 71, an LED 72, wires 73, a light-permeable mold resin 74 and a driving integrated circuit 76 for driving the LED 72. Each wire 73 is constituted of a wire that has electrical conductivity, such as an Au wire, an Ag wire or an Al wire. Moreover, the mold resin 74 is formed by adding glass as filler to an epoxy base resin.

The driving integrated circuit 76 incorporates a correction circuit for correcting the driving current of the LED 72 such that the driving current increases as the temperature rises. The correction circuit compensates an effect of reduction in the optical output power of the LED 72.

Figure 8:
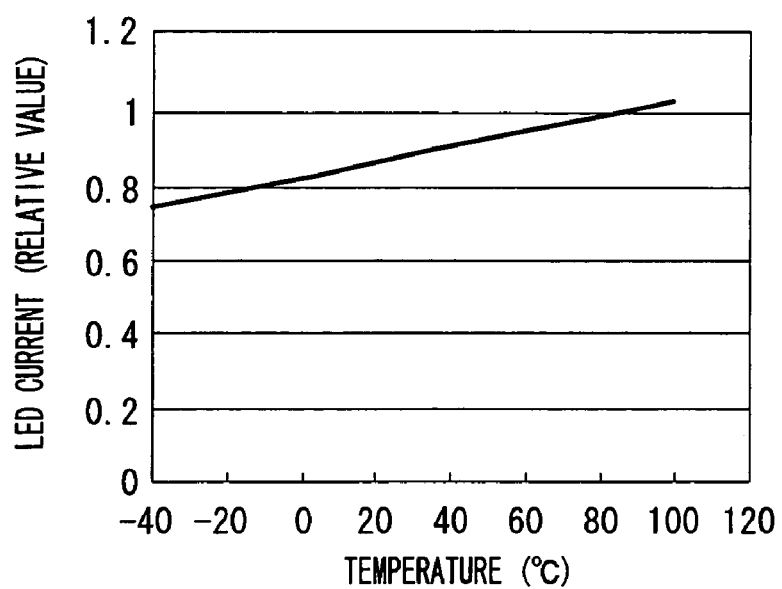
FIG. 8 is a graph showing the temperature dependence of an LED driving current outputted from a driving integrated circuit.

FIG. 8 is a graph showing the temperature dependence of an LED driving current outputted from the driving integrated circuit 76.

In FIG. 8, the LED driving current at 85° C. is given a value of one, and the LED driving currents at other temperatures are represented by relative values with respect to the LED driving current at 85° C.

As shown in FIG. 8, the LED driving current is set to increase as the temperature rises. This can easily be achieved by setting the temperature dependence of a resistance of the driving integrated circuit 76 so that the resistance decreases as the temperature rises.

Figure 9:
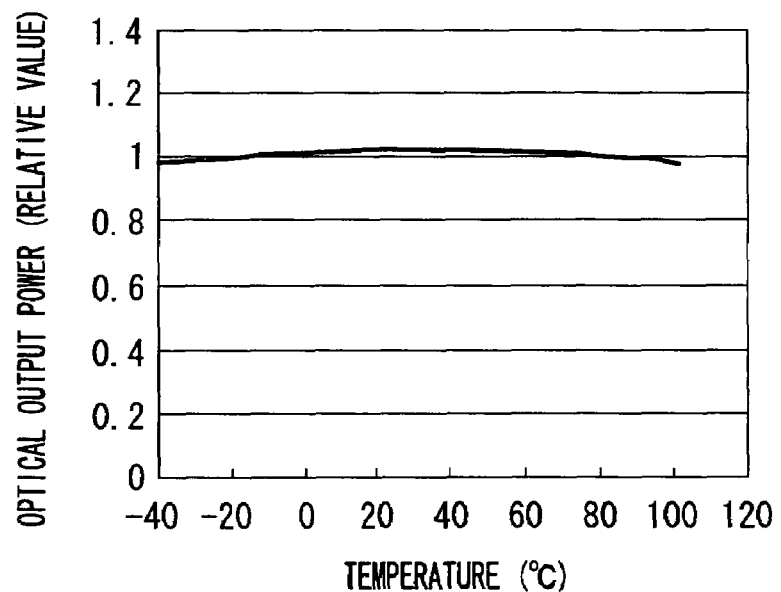
FIG. 9 is a graph showing the optical output power of the optical semiconductor device of the third embodiment.

FIG. 9 is a graph showing the optical output power of the optical semiconductor device of the third embodiment.

In FIG. 9, the optical output power of the optical semiconductor device at 85° C. is given a value of one, and the optical output powers of the optical semiconductor device at other temperatures are represented by relative values with respect to the optical output power of the optical semiconductor device at 85° C.

In the optical semiconductor device of the third embodiment, the characteristic of the LED 72 that the output power decreases as the temperature rises is compensated for by the correction circuit of the driving integrated circuit 76. Therefore, the optical semiconductor device is allowed to have good operation characteristics free from the temperature dependence within the operating temperature range.

In the optical semiconductor device of the third embodiment, the device characteristics of the LED 72 are compensated for by the correction circuit of the driving integrated circuit 76, so that the operating characteristics of the optical semiconductor device are made excellent free from the temperature dependence within the operating temperature range. However, it is acceptable to make the operating characteristics of the optical semiconductor device free from the temperature dependence within the operating temperature range by counterbalancing the operating characteristic that the output power decreases as the temperature of the LED rises both with the characteristic that the LED driving current is increased as the temperature of the driving integrated circuit rises and with the characteristic that the light transmittance increases as the temperature of the resin mold portion rises.

Moreover, according to the present invention, it is also acceptable to make the operating characteristics of the optical semiconductor device free from the temperature dependence within the operating temperature range by counterbalancing the operating characteristic that the output power decreases as the temperature of the LED rises and a characteristic that the LED driving current decreases as the temperature of the driving integrated circuit rises with the characteristic that the light transmittance increases as the temperature of the resin mold portion rises.

Although the optical semiconductor device according to the first, second, or third embodiment has either a light-emitting element or a photodetector, the optical semiconductor device of the present invention may have both the light-emitting element and the photodetector, and they may be encapsulated in an identical mold resin package. Moreover, in the optical semiconductor device of the present invention, a light-emitting element driving circuit and a photodetector amplifier circuit besides the light-emitting element and the photodetector may be encapsulated in the identical resin package.

Fourth Embodiment

Figure 10:
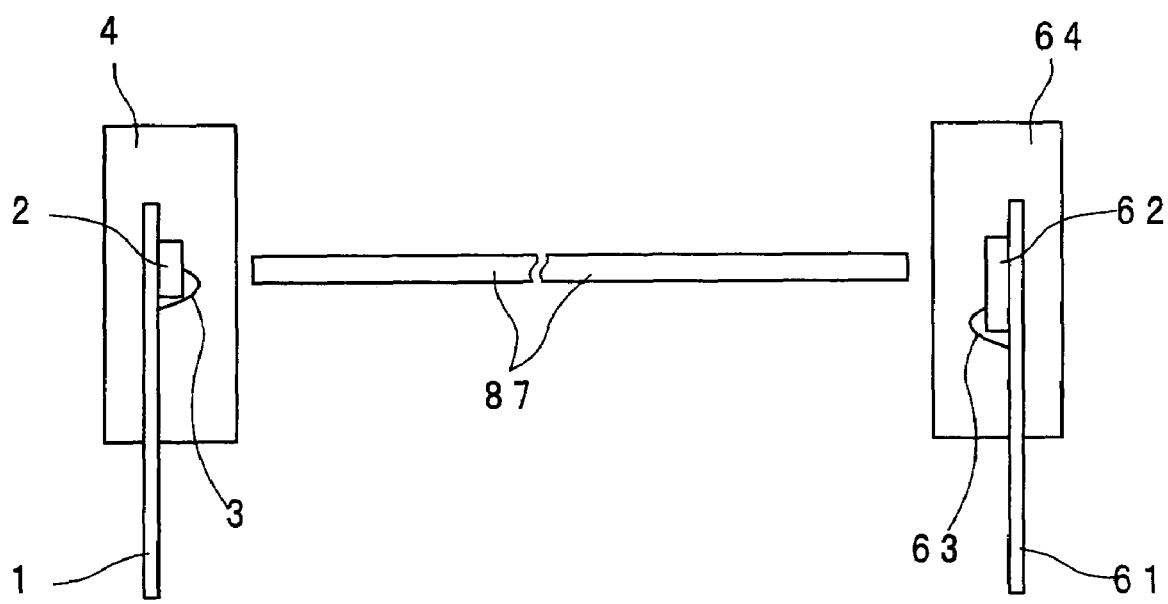
FIG. 10 is a view of one embodiment of the optical communication device of the present invention.

FIG. 10 is a view showing one embodiment of the optical communication device of the present invention.

The optical communication device has the optical semiconductor device of the first embodiment, the optical semiconductor device of the second embodiment and an optical fiber 87.

The optical fiber 87 plays the role of transmitting the light emitted from the optical semiconductor device of the first embodiment to the optical semiconductor device of the second embodiment.

Generally, it is known that the optical fiber easily absorbs moisture due to a temperature rise and the attenuation of the communication light passing through the optical fiber is increased by moisture absorption in the optical fiber of the transmission medium. It is also known that the attenuation of the communication light passing through the optical fiber is increased by a change in the wavelength of the communication light to a longer one. Moreover, it is generally known that the emission wavelength of the light-emitting element as an optical semiconductor element is changed by a temperature rise.

In the optical communication device, the rate of increase in the transmittance of the encapsulating resin of the optical semiconductor device of the first embodiment per the temperature rise corresponds to the attenuation rate of the communication light due to moisture absorption per the temperature rise of the optical fiber and the attenuation rate of the communication light passing through the optical fiber due to a change in the wavelength of the communication light to a longer one. In other words, the rate of increase in the transmittance of the encapsulating resin of the optical semiconductor device of the first embodiment per the temperature rise roughly counterbalances the attenuation rate of the communication light due to moisture absorption per the temperature rise of the optical fiber and the attenuation rate of the communication light passing through the optical fiber caused by the change in the wavelength of the communication light to a longer one.

Then, by controlling the rate of increase in the optical output power of the optical semiconductor device of the first embodiment with respect to the temperature rise, the optical output of light incident on the optical semiconductor device of the second embodiment from the optical fiber is made roughly constant in spite of the temperature rise. With this arrangement, the optical communication device is allowed to have a reduced temperature dependence of the communication light exchanged and to achieve optical transmission of high communication quality.

In the embodiment, the attenuation rate of the communication light of the optical fiber is compensated and canceled by the rate of increase in light transmittance due to the temperature rise of the encapsulating resin of the optical semiconductor device of the first embodiment. However, according to the present invention, it is acceptable to cancel the temperature dependence of the quantity of light emitted from the LED of the optical semiconductor device of the first embodiment by the rate of increase in light transmittance due to the temperature rise of the encapsulating resin of the optical semiconductor device of the first embodiment, and also cancel the attenuation rate of the communication light of the optical fiber by the rate of increase in light transmittance due to the temperature rise of the encapsulating resin of the optical semiconductor device of the second embodiment.

Moreover, it is also acceptable to cancel the temperature dependence of the quantity of light emitted from the LED of the optical semiconductor device of the first embodiment and the attenuation of the communication light of the optical fiber by a total of the rates of increase in light transmittance due to the temperature rise of the encapsulating resins of the optical semiconductor devices of the first and second embodiments.

Fifth Embodiment

Figure 11:
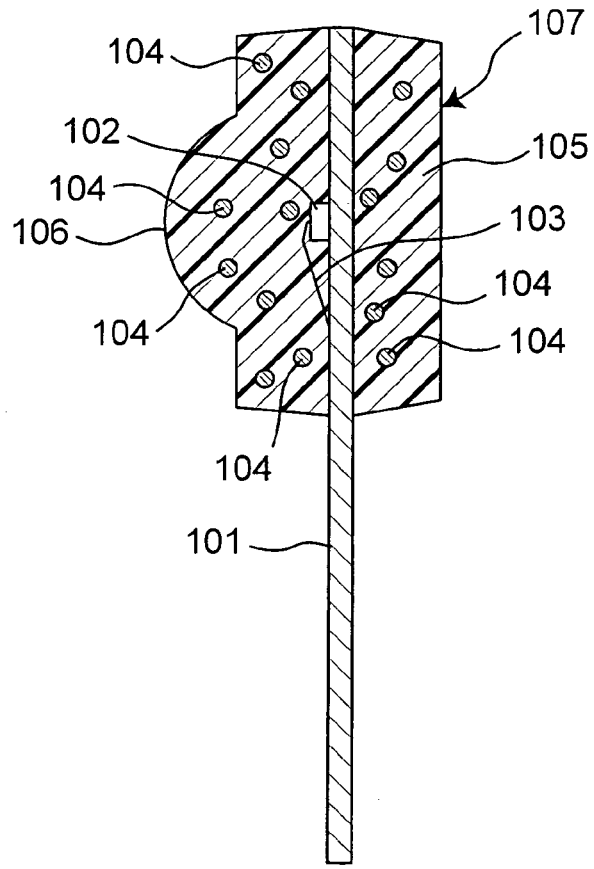
FIG. 11 is a sectional view of an optical semiconductor element according to an embodiment of the present invention.

FIG. 11 shows a sectional view of an optical semiconductor device according to one embodiment of the present invention. The optical semiconductor device has a lead frame 101 and an optical semiconductor chip 102 mounted on the lead frame 101.

The optical semiconductor chip 102 is die-bonded to the lead frame 101 by using a conductive resin of an Ag paste or the like. The lead frame 101 and the optical semiconductor chip 102 are electrically connected to each other via a wire 103 (e.g., a gold wire).

The optical semiconductor chip 102 and the wire 103 are encapsulated in a mold resin portion 107 that has light permeability.

The optical semiconductor chip 102 is, for example, a light-emitting diode and emits light to the outside of the mold resin portion 107. Otherwise, the optical semiconductor chip 102 is, for example, a photodiode, and receives light from the outside of the mold resin portion 107.

The mold resin portion 107 contains a phenolic cured resin 105 as a base or matrix and a plurality of pieces of transparent filler 104. The phenolic cured resin 105 is a kind of an epoxy resin that contains a phenolic curing agent. The pieces of transparent filler 104 have a generally spherical shape and are made of silica glass. Materials of the phenolic cured resin 105 and the transparent filler 104 are adjusted such that an absolute value of a refractive index difference between the phenolic cured resin 105 and the transparent filler 104 is 0.02 or less as far as the operation temperature of the optical semiconductor device falls within a range of from −40° C. to 105° C.

The mold resin portion 107 has a lens 106. That is, the lens 106 is formed integrated with the resin 105. The transparent filler 104 is placed in the lens 106.

Figure 12:
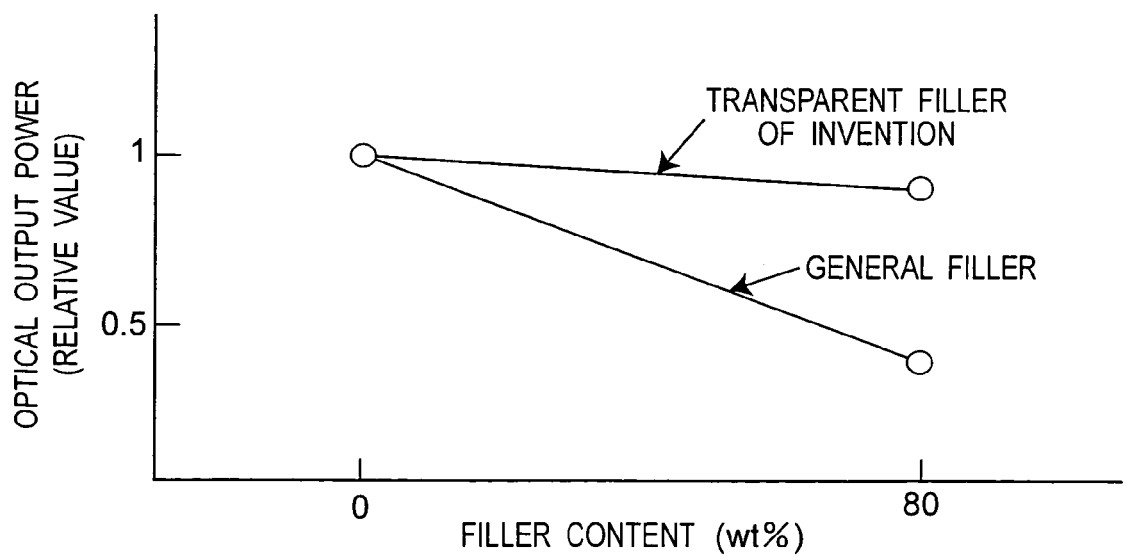
FIG. 12 is a graph showing the relation between the filler content and the optical output power.

Next, FIG. 12 shows the relation between the filler content and the optical output power. As shown in FIG. 12, assuming that the optical output power when the filler content is 0 wt % is one ("1"), then the optical output power of the general filler is reduced to about 0.4 when the filler content is 80 wt %. On the other hand, the optical output power of the transparent filler does not fall below a level of about 0.9, which practically causes no problem. The "general filler" here means crushed filler of which the refractive index is not regulated.

As described above, the optical semiconductor device of the present invention employs the transparent filler 104.

Therefore, the optical output power becomes more satisfactory than when the general filler is employed.

Figure 13:
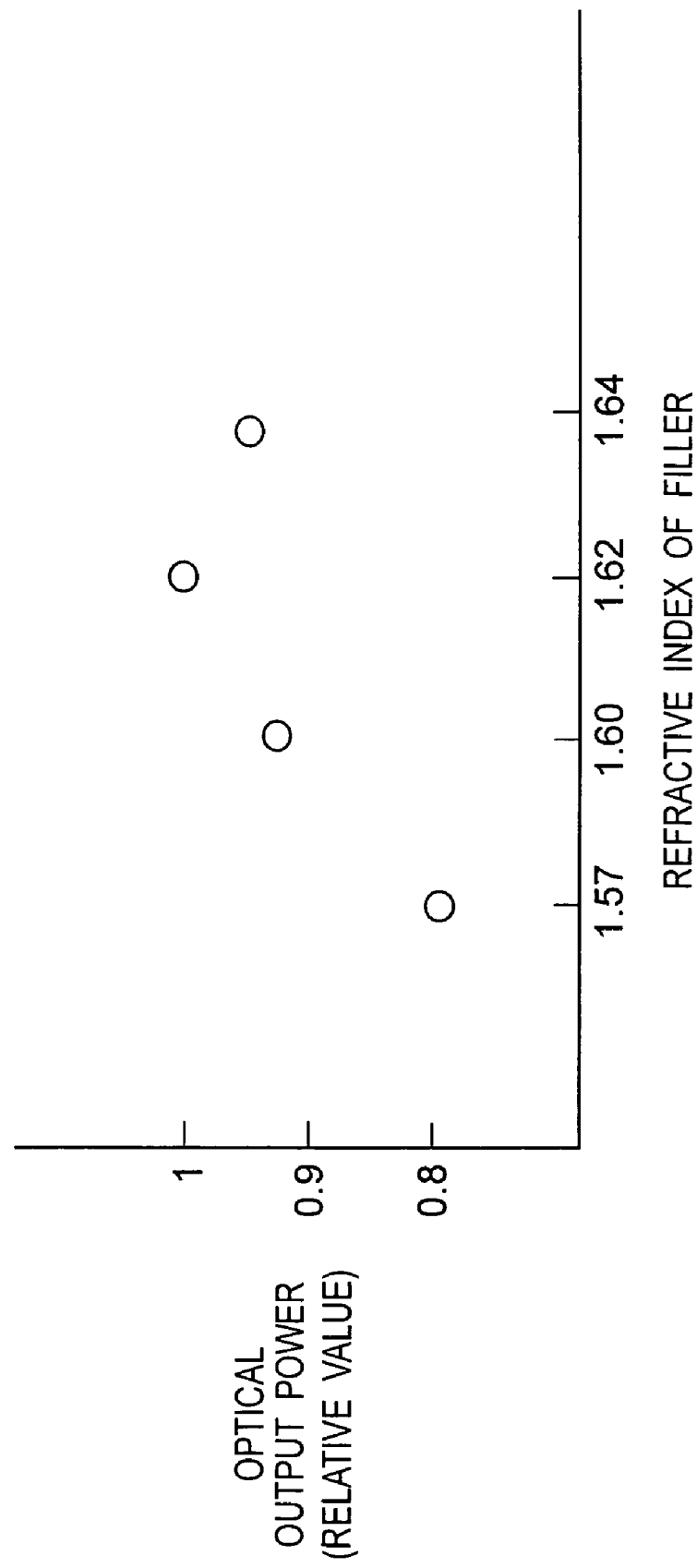
FIG. 13 is a graph showing the relationship between the refractive index of transparent filler and the optical output power.

Next, FIG. 13 shows the relation between the refractive index of the transparent filler and the optical output power. As shown in FIG. 13, assuming that the optical output power when the refractive index is 1.62 is one, it can be understood that the reduction in optical output power falls within a range of 10% when the refractive index of the contained transparent filler is 1.60 and 1.64 and the optical output power is reduced by about 20% when the refractive index of the contained transparent filler is 1.57.

As can be understood from the above, by virtue of the fact that the refractive index of the phenolic cured resin 105 of the base is 1.62, the reduction in light transmittance of the mold resin portion 107 is substantially suppressed by setting the absolute value of the refractive index difference between the transparent filler 104 and the phenolic cured resin 105 to 0.02 or less. As described above, materials of the phenolic cured resin 105 and the transparent filler 104 are adjusted such that an absolute value of a refractive index difference between the phenolic cured resin 105 and the transparent filler 104 is 0.02 or less as far as the operation temperature of the optical semiconductor device falls within a range of from −40° C. to 105° C. Thus, not only at an operating temperature of 25° C. but also at any operating temperature within the above-specified temperature range, the mold resin portion 107 has a satisfactory light transmittance.

Figure 14:
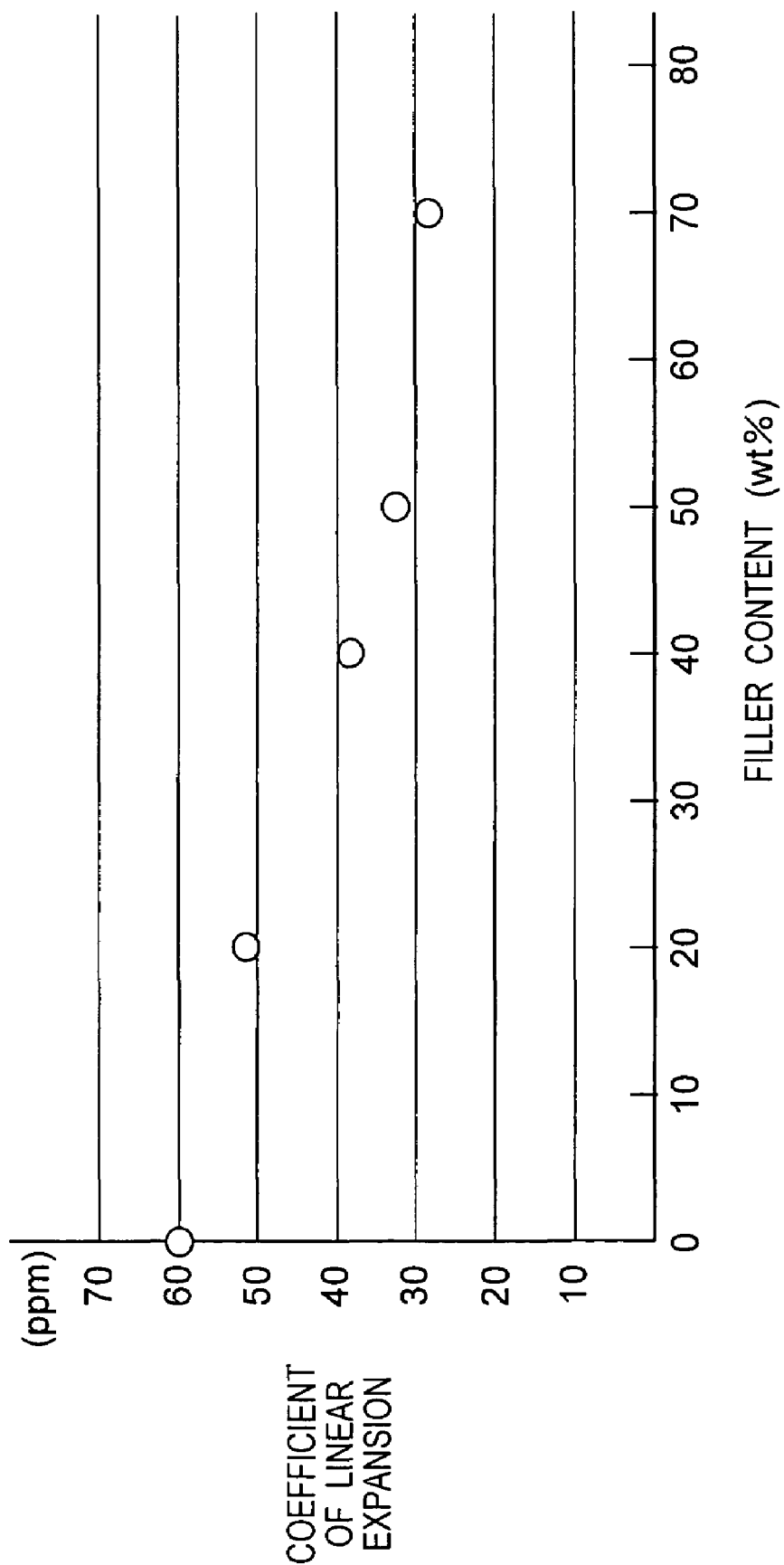
FIG. 14 is a graph showing the relationship between the transparent filler content and the coefficient of linear expansion.

Next, FIG. 14 shows the relation between the transparent filler content and the coefficient of linear expansion. The coefficients of linear expansion of the parts employed in the optical semiconductor device of the present invention will be first described. The coefficient of linear expansion of the lead frame 101 is about 17 ppm, that of the optical semiconductor chip 102 is about 3 to 8 ppm, and that of the wire (gold wire) 3 is about 14 ppm.

Then, in order to secure the reliability for the in-vehicle use (i.e., to tolerate the use at a temperature of about −40° C. to 105° C.), it is important to match the coefficients of linear expansion of the parts as far as possible. In consideration of the coefficients of linear expansion of the above-described parts, the coefficient of linear expansion of the mold resin portion 107 is required to be 40 ppm or less. In this connection, the coefficient of linear expansion of an acid-anhydrous cured epoxy resin (i.e., an epoxy resin containing an acid anhydride as a curing agent) used for the conventional optical semiconductor device is about 65 ppm.

That is, as shown in FIG. 14, the transparent filler content is required to be not smaller than 40 wt %. On the other hand, because of the disadvantage that the flow of the resin during molding becomes worse when the transparent filler content is excessively increased, the upper limit of the transparent filler content is 80 wt % from the viewpoint of molding.

As described above, by setting the transparent filler content to 40 to 80 wt %, the difference in the coefficient of linear expansion between the mold resin portion 107 and parts encapsulated in the mold resin portion 107 (each referred to as an encapsulated part) is reduced, and high reliability is achievable.

According to the above construction, due to the use of the phenolic cured resin 105 and inclusion therein of the 40 to 80 wt % transparent filler 104 made of silica glass, of which the absolute value of the refractive index difference to that of the phenolic cured resin is not greater than 0.02, the optical semiconductor device becomes a highly reliable optical semiconductor device, which has light transmittance on the level equivalent to that of the acid-anhydrous cured resin and in which the disconnection of the wire 103 and the occurrence of cracks in the package are suppressed.

Figure 15:
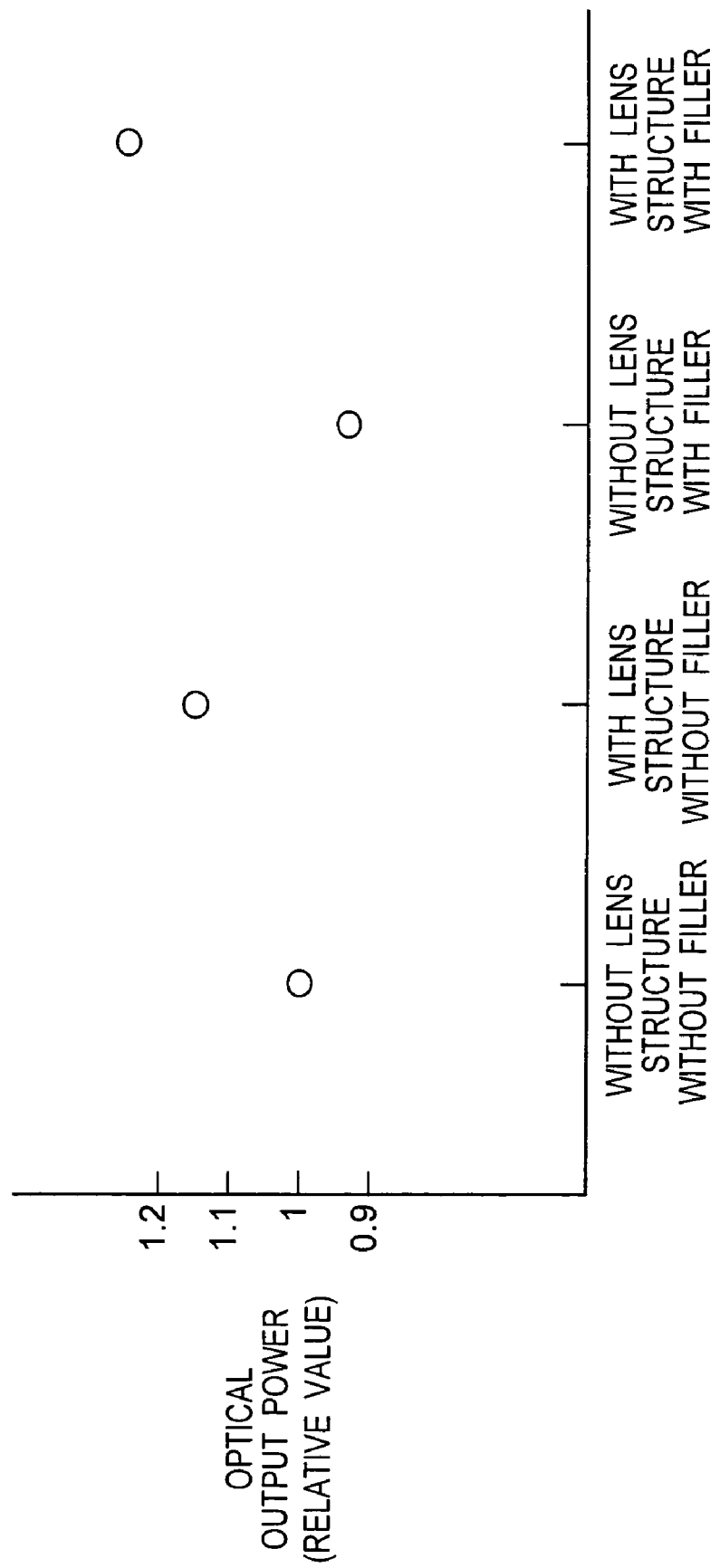
FIG. 15 is a graph showing the relationship among the presence or absence of the transparent filler, the presence or absence of a lens structure, and the optical output power.
Figure 16:
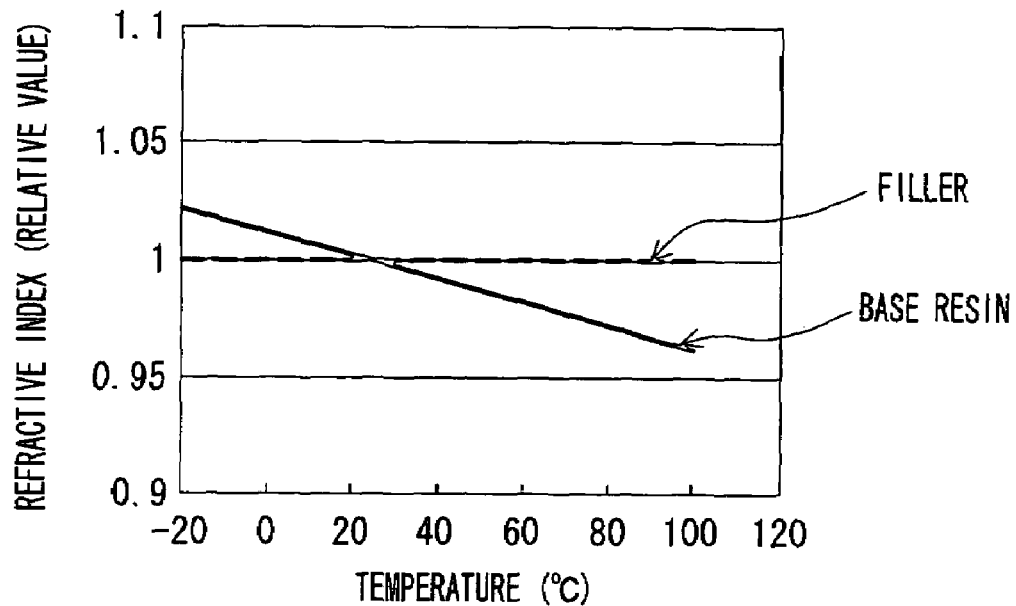
FIG. 16 is a graph showing the temperature dependence of the refractive index of a resin mold material to which glass is added as a filler material and the temperature dependence of the refractive index of a base resin mold material.
Figure 17:
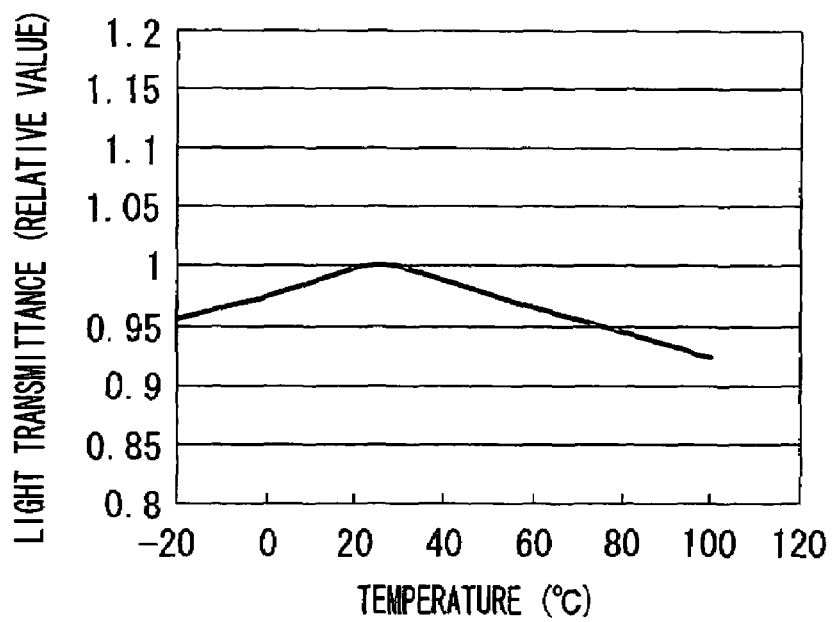
FIG. 17 is a graph showing the temperature dependence of the light transmittance of a resin mold material in which filler is added to a base resin.
Figure 18:
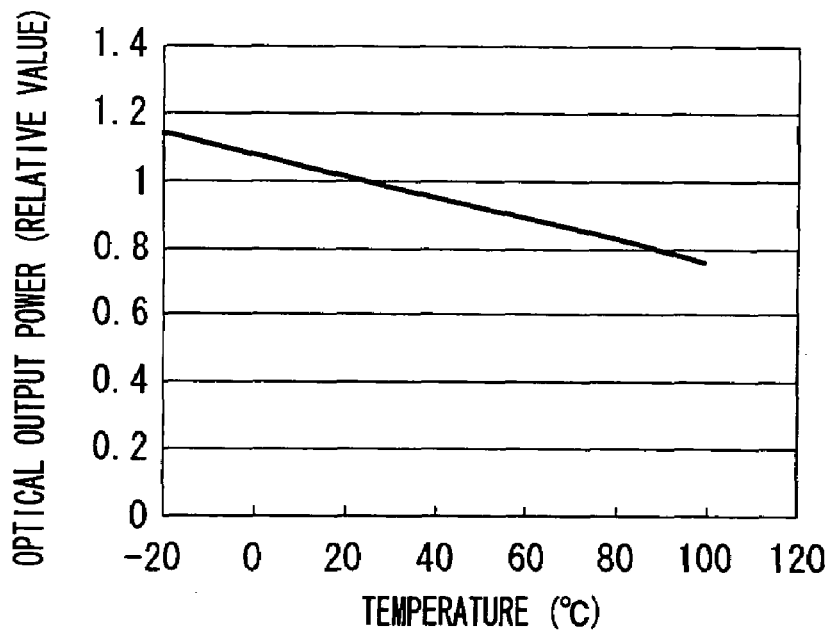
FIG. 18 is a graph showing the temperature dependence of the optical output power of a general LED.
Figure 19:
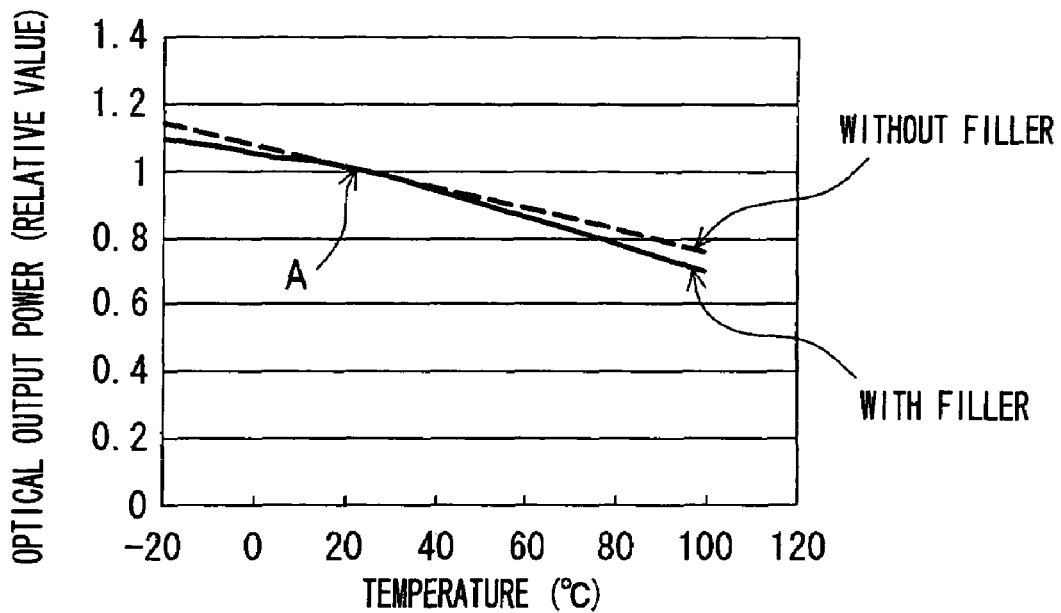
FIG. 19 is a graph showing the measurement result of the temperature dependence of the optical output power when an LED is encapsulated in a light-permeable resin to which no filler is added and the measurement result of the temperature dependence of the optical output power when the LED is encapsulated in the light-permeable resin to which filler is added.

Next, FIG. 15 shows the optical output power characteristic in the presence/absence of spherical transparent filler and the presence/absence of a lens structure. It can be understood from FIG. 15 that, when the spherical transparent filler pieces or particles are present, the scattering of light at the interface between each transparent filler piece and the phenolic cured resin is suppressed, and the effect of the lens on the optical output power is larger than in the case of no filler.

That is, by adding the spherical transparent filler and further providing the lens at the mold resin portion (i.e., providing a lens structure by molding the package into a lens shape), it becomes possible to provide an optical semiconductor device which has an improved optical output power and improved light transmittance.

Sixth Embodiment

Referring to a difference from the fifth embodiment, the mold resin portion 107 contains a release agent in the sixth embodiment. The release agent contained in the phenolic cured resin 105 makes it possible to provide an optical semiconductor device that offers good manufacturing efficiency.

That is, normally, in the resin encapsulation process with the acid anhydrous cured resin, a release agent is conventionally applied to a metal mold every one shot of molding. However, the process of applying the release agent to the metal mold has been a bottleneck obstructing the automatization of the production. In order to solve that problem of the production, the release agent is preliminarily included in the resin for the elimination of the process step of applying the release agent every one shot. By thus doing, it becomes possible to automatize the production. In short, it is not required to apply the release agent to a metal mold before molding the optical semiconductor device with the metal mold, so that the manufacturing efficiency is improved.

Seventh Embodiment

Electronic equipment of the present embodiment has any one of the optical semiconductor devices according to the first through third embodiments or the fifth or sixth embodiment. The electronic equipment may be electronic equipment particularly for use in the environments of a wide operating temperature range, as exemplified by electronic equipment of in-vehicle equipment, a sensor for a robot in a factory, or control equipment. The in-vehicle equipment includes, for example, an in-car audio system, a car navigation system, a sensor, and the like.

The electronic equipment may also be electronic equipment used in general environments, as exemplified by a digital TV (television) set, a digital BS (Broadcasting Satellite) tuner, a CS (Communication Satellite) tuner, a DVD (Digital Versatile Disc) player, a super audio CD (Compact Disc) player, an AV (Audio Visual) amplifier, an audio device, a personal computer, a personal computer peripheral, a portable telephone, a PDA (Personal Digital Assistant), or the like.

When the optical semiconductor device of the present invention is applied to the electronic equipment, the operating characteristics of the electronic equipment are allowed to be stabilized with little temperature dependence and made highly reliable.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An optical semiconductor device comprising:
   an optical semiconductor element; and
   a light-permeable resin that is arranged to encapsulate the optical semiconductor element and that comprises a base resin and filler, wherein
   the light-permeable resin a transmittance that increases with a temperature rise within an operating temperature range.

2. The optical semiconductor device as claimed in claim 1, wherein
   the base resin and the filler of the light-permeable resin have refractive indexes that coincide with each other at one temperature equal to or higher than an upper limit of the operating temperature range.

3. The optical semiconductor device as claimed in claim 1, wherein
   the optical semiconductor element is a light-emitting element.

4. The optical semiconductor device as claimed in claim 1, wherein
   the optical semiconductor element is a photodetector.

5. The optical semiconductor device as claimed in claim 3, wherein
   a factor of transmittance increase of the light-permeable resin due to a temperature rise roughly counterbalances a factor of optical output power reduction of the light-emitting element due to the temperature rise.

6. The optical semiconductor device as claimed in claim 5, wherein
   the factor of transmittance increase of the light-permeable resin corresponds to an amount of the filler in the light-permeable resin.

7. The optical semiconductor device as claimed in claim 5, wherein
   the factor of transmittance increase of the light-permeable resin corresponds to a quantity of decrease in refractive index of the base resin of the light-permeable resin with the temperature rise.

8. The optical semiconductor device as claimed in claim 3, further comprising a light-emitting element driving circuit for driving the light-emitting element, wherein
   the light-emitting element driving circuit has a correction circuit for correcting a variation in the optical output power of the light-emitting element due to a temperature rise.

9. The optical semiconductor device as claimed in claim 8, wherein
   a reduction in the optical output power of the light-emitting element due to the temperature rise is canceled by an increase in the transmittance of the light permeable resin due to the temperature rise and a correction of the variation in the optical output power by the correction circuit of the light-emitting element driving circuit.

10. An optical communication device comprising the optical semiconductor device as claimed in claim 1 and an optical fiber so as to transmit and/or receive an optical signal using the optical fiber as a transmission medium, wherein
    an attenuation rate of communication light in the optical fiber due to a temperature rise of the optical fiber corresponds to a factor of transmittance increase due to a temperature rise of the light-permeable resin of the optical semiconductor device.

11. An optical communication device comprising
    the optical semiconductor device as claimed in claim 1 and an optical fiber to transmit and/or receive an optical signal using the optical fiber as a transmission medium, wherein a rate of attenuation of communication light in the optical fiber ascribed to a change in emission wavelength due to a temperature rise of the optical semiconductor element in the optical semiconductor device corresponds to a factor of transmittance increase due to a temperature rise of the light-permeable resin.

12. An optical semiconductor device, comprising:
    an optical semiconductor element; and
    a mold resin portion having light permeability that encapsulates the optical semiconductor element, wherein the optical semiconductor element emits light to outside the mold resin portion or receives light incident from outside the mold resin portion, and the mold resin portion comprises a phenolic cured resin and spherical, transparent filler pieces made of silica glass, wherein
    a content of the transparent filler in the mold resin portion that is greater than 60 wt % and less than or equal to 80 wt %.

13. The optical semiconductor device as claimed in claim 12, wherein an absolute value of a refractive index difference between the transparent filler and the phenolic cured resin is not greater than 0.02 as far as an operating temperature of the device is within a range of from −40° Celsius to 105° Celsius.

14. The optical semiconductor device as claimed in claim 12, wherein the mold resin portion has a lens.

15. The optical semiconductor device as claimed in claim 12, wherein the mold resin portion contains a release agent.

16. Electronic equipment comprising the optical semiconductor device as claimed in any one of claims 1-9, 12-13, and 14-15.

* * * * *